United States Patent
Chen

(10) Patent No.: US 9,391,119 B2
(45) Date of Patent: Jul. 12, 2016

(54) NON-VOLATILE RANDOM ACCESS MEMORY DEVICES WITH SHARED TRANSISTOR CONFIGURATION AND METHODS OF FORMING THE SAME

(71) Applicant: GLOBALFOUNDRIES, Inc., Grand Cayman (KY)

(72) Inventor: An Chen, Los Altos, CA (US)

(73) Assignee: GLOBALFOUNDRIES, INC., Grand Cayman (KW)

( * ) Notice: Subject to any disclaimer, the term of this patent is extended or adjusted under 35 U.S.C. 154(b) by 0 days.

(21) Appl. No.: 14/310,460

(22) Filed: Jun. 20, 2014

(65) Prior Publication Data
US 2015/0372055 A1 Dec. 24, 2015

(51) Int. Cl.
| G11C 11/16 | (2006.01) |
|---|---|
| G11C 5/02 | (2006.01) |
| G11C 5/06 | (2006.01) |
| H01L 27/24 | (2006.01) |
| H01L 27/22 | (2006.01) |
| H01L 45/00 | (2006.01) |

(52) U.S. Cl.
CPC ............ *H01L 27/224* (2013.01); *H01L 27/228* (2013.01); *G11C 11/16* (2013.01); *G11C 11/1659* (2013.01); *G11C 2213/79* (2013.01); *H01L 27/2418* (2013.01); *H01L 45/04* (2013.01)

(58) Field of Classification Search
CPC ............ G11C 11/16; G11C 11/1659; G11C 2213/79; H01L 27/2418; H01L 45/04
USPC .............................. 365/148, 158, 163, 51, 63
See application file for complete search history.

(56) References Cited

U.S. PATENT DOCUMENTS

| 5,166,901 | A  * | 11/1992 | Shaw | G11C 17/16 257/476 |
|---|---|---|---|---|
| 7,046,545 | B2 * | 5/2006 | Hosotani | G11C 11/16 257/E27.005 |
| 8,686,386 | B2 * | 4/2014 | Tendulkar | H01L 45/1608 257/2 |
| 8,981,463 | B2 * | 3/2015 | Sandhu | H01L 27/1021 257/329 |
| 2001/0021124 | A1* | 9/2001 | Odagawa | G11C 11/16 365/158 |
| 2010/0061142 | A1* | 3/2010 | Arita | G11C 13/0007 365/148 |
| 2012/0081946 | A1* | 4/2012 | Kawabata | G11C 11/5685 365/148 |
| 2013/0329484 | A1* | 12/2013 | Tamai | G11C 13/0069 365/148 |
| 2015/0009752 | A1* | 1/2015 | Park | G11C 11/5678 365/163 |

OTHER PUBLICATIONS

Zhao et al., Crossbar Architecture Based on 2R Complementary Resistive Switching Memory Cell, IEEE/ACM International Symposium on Nanoscale Architectures (NANOARCH), 2012, pp. 85-92.
Zhao et al., Cross-Point Architecture for Spin-Transfer Torque Magnetic Random Access Memory, IEEE Transactions on Nanotechnology, Sep. 2012, pp. 907-917, vol. 11, No. 5.

* cited by examiner

*Primary Examiner* — Ly D Pham
(74) *Attorney, Agent, or Firm* — Ingrassia Fisher & Lorenz, P.C.

(57) ABSTRACT

Embodiments of non-volatile random access memory (RAM) devices and methods of forming the same are provided herein. In an embodiment, a non-volatile RAM device includes a first access transistor that is in electrical communication with a wordline. A first memory element and a first two-terminal selector are serially connected to each other and are in electrical communication with a first bitline and the first access transistor. A second memory element and a second two-terminal selector are serially connected to each other and are in electrical communication with a second bitline and the first access transistor.

14 Claims, 2 Drawing Sheets

NON-VOLATILE RANDOM ACCESS MEMORY DEVICES WITH SHARED TRANSISTOR CONFIGURATION AND METHODS OF FORMING THE SAME

TECHNICAL FIELD

The technical field generally relates to non-volatile random access memory devices and methods of forming the same. More particularly, the technical field relates to non-volatile random access memory devices with memory elements sharing an access transistor and methods of forming such devices.

BACKGROUND

Various types and configurations of non-volatile random access memory device have been developed, with a continued drive to minimize device size and maximize memory element density within the devices. Many emerging memory elements have a two-terminal structure and are configured as a 1-transistor-1-memory element (1T1M) cell. In the 1T1M cells, access transistor footprint generally dominates device size design constraints, with memory elements generally having significantly smaller dimensions than the access transistors. For example, various memory elements may have a footprint of about $4F^2$, where F represents Minimum Feature Size and is commonly employed as a unit of measure for memory elements. However, many access transistors have a footprint that is significantly higher than $4F^2$, with some access transistors having a footprint of up to $100F^2$ or larger due to transistor layout and current requirements.

Given the generally larger footprint of access transistors as compared to memory elements, memory device architecture has been developed to enable multiple memory elements to share a single access transistor. For example, crossbar arrays (CBAs) and shared access transistor designs have been proposed for increasing density of memory elements while maintaining the 1T1M cell configuration. With sharing of the single access transistor and shared electrical connections between memory elements, current leakage paths exist between the memory elements, with leakage current passing through non-selected memory elements. In particular, "current leakage", as referred to herein, refers to loss of current through non-selected memory elements and bitline interconnections due to the interconnected relationship of the memory elements with selected memory elements and bitline connections. As a result, a signal for a selected memory element may be obscured due to the loss of leakage current through the other connected memory elements.

Accordingly, it is desirable to provide non-volatile random access memory device and methods of forming the same with maximized memory element density and with minimized current leakage between memory elements. Furthermore, other desirable features and characteristics of the present invention will become apparent from the subsequent detailed description and the appended claims, taken in conjunction with the accompanying drawings and this background.

BRIEF SUMMARY

Embodiments of non-volatile random access memory (RAM) devices and methods of forming the same are provided herein. In an embodiment, a non-volatile RAM device includes a first access transistor that is in electrical communication with a wordline. A first memory element and a first two-terminal selector are serially connected to each other and are in electrical communication with a first bitline and the first access transistor. A second memory element and a second two-terminal selector are serially connected to each other and are in electrical communication with a second bitline and the first access transistor.

In another embodiment, a non-volatile RAM device includes a first shared access transistor that is in electrical communication with a wordline. A first magnetic tunneling junction and a first two-terminal selector are serially connected to each other and are in electrical communication with a first bitline and the first shared access transistor. A second magnetic tunneling junction and a second two-terminal selector are serially connected to each other and are in electrical communication with a second bitline and the first shared access transistor. From 1 to about 50 additional memory element and two-terminal selector pairs are provided, with the respective memory elements and two-terminal selectors serially connected to each other and in electrical communication with a respective bitline and the first shared access transistor.

In another embodiment, a method of forming a non-volatile random access memory device includes forming a first access transistor on a semiconductor substrate. A first memory element and a second memory element are formed in electrical communication with the first access transistor. A first two-terminal selector is serially connected with the first memory element and a second two-terminal selector is serially connected with the second memory element. A first bitline is formed in electrical communication with the first memory element and the first two-terminal selector and a second bitline is formed in electrical communication with the second memory element and the second two-terminal selector.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Non-volatile random access memory (RAM) devices and methods of forming the non-volatile RAM devices are provided herein. The non-volatile RAM devices include a first access transistor that is in electrical communication with a wordline, and a first memory element and a second memory element that are both in electrical communication with the first access transistor. The first memory element is also in electrical communication with a first bitline, and the second memory element is also in electrical communication with a second bitline. The devices further include a first two-terminal selector that is serially connected with the first memory element and a second two-terminal selector that is serially connected with the second memory element. It is to be appreciated that the devices may include numerous additional memory element and two-terminal selector pairs that are serially connected and in electrical communication with the first access transistor. With the described configuration, the first memory element and the second memory element are electrically connected to the same first access transistor. Various configurations of the first access transistor, first memory element, and second memory element are possible, such as a crossbar array (CBA) or a shared accessed transistor configuration. Whereas leakage current is often a concern with CBA and shared access transistor configurations, the presence of the first two-terminal selector and the second two-terminal selector effectively blocks leakage current by providing sufficiently high resistance at relatively low voltages of typical leakage current while also exhibiting relatively low resistance at higher voltages generally associated with selected bitlines. The two-terminal selectors are also effective to block leakage current in CBA and shared access transistor configurations that employ memory elements that generally required relatively high current, such as magnetic tunneling junctions (MTJs). As such, maximized memory element density is possibly by electrically connecting the first memory element and the second memory element to the same first access transistor while also blocking leakage current, which is particularly problematic when the MTJs are used.

Figure 1:
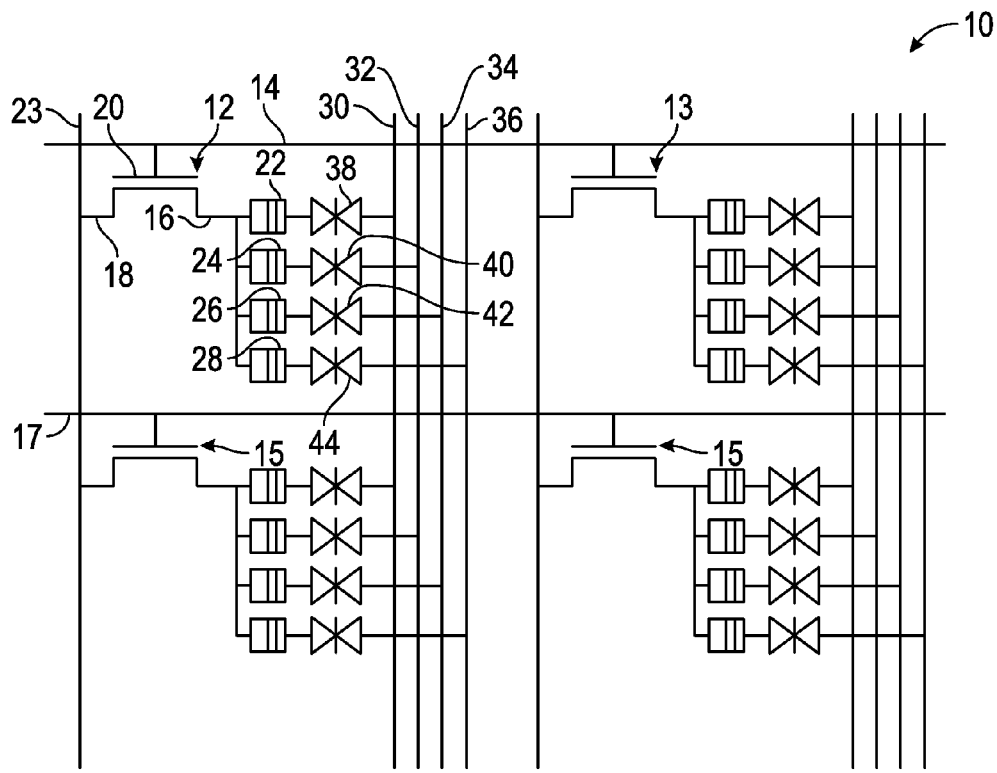
FIG. 1 is a schematic diagram of a non-volatile random access memory device including an array of access transistors with multiple memory element and two-terminal selector pairs electrically connected to each access transistor in accordance with an embodiment.

Referring to FIG. 1, an embodiment of a non-volatile RAM device 10 will now be described. The non-volatile RAM device 10 includes a first access transistor 12 that is in electrical communication with a wordline 14. It is to be appreciated that additional access transistors 13 may be in electrical communication with the wordline 14, and it is also to be appreciated that additional wordlines 17 may be present with yet additional access transistors 15 in electrical communication with the additional wordlines 17 to form an array. The first access transistor 12 includes a source 16, a drain 18, and a gate structure 20 in accordance with conventional transistor architecture (it is to be appreciated that the relative positions of the source 16 and the drain 18 may be transposed). The wordline 14 is in electrical communication with the gate structure 20 of the first access transistor 12, and the drain 18 is in electrical communication with a ground line 23. A first memory element 22 and a first two-terminal selector 38 are serially connected and in electrical communication with the first access transistor 12, e.g., through the source 16 of the first access transistor 12 (although it is to be appreciated that the first memory element 22 and the first two-terminal selector 38 may be in electrical communication with the first access transistor 12 through the drain 18 depending upon the type of metal-oxide-semiconductor field-effect transistor (MOSFET) employed as the first access transistor 12). As shown in FIG. 1, the first memory element 22 and the second memory element 24 share a connection to the first access transistor 12. The first memory element 22 and the first two-terminal selector 38 are also in electrical communication with a first bitline 30. Further, a second memory element 24 and a second two-terminal selector 40 are in electrical communication with the first access transistor 12 and a second bitline 32. It is to be appreciated that the device 10 may include numerous additional memory element and two-terminal selector pairs, with FIG. 1 showing four memory elements 22, 24, 26, 28 and respective two-terminal selectors 38, 40, 42, 44 for illustrative purposes only. However, it is to be appreciated that the device may include from 1 to about 50 additional memory element and two-terminal selector pairs in electrical communication with the first access transistor 12, depending upon the relative footprint of the first access transistor 12 and the memory elements 22, 24, 26, 28. As shown in FIG. 1, the additional memory elements 26, 28 and respective two-terminal selectors 42, 44 are in electrical communication with additional bitlines 34, 36. Via the wordline 14, the first access transistor 12 controls access to memory elements 22, 24, 26, 28 that are connected to the source 16 of the first access transistor 12 and current applied to the respective bitlines 30, 32, 34, 36 controls programming and/or erasing of the respective memory elements 22, 24, 26, 28.

Size of the first access transistor may vary depending upon memory elements connected thereto and the current requirements of the memory elements. For example, in embodiments, the first access transistor has a footprint, i.e., covers an area in the device, of from about $6F^2$ to about $100F^2$, such as from about 10 to about $100F^2$, such as from about 50 to about $100F^2$, where F represents Minimum Feature Size and is a unit of measure for memory elements included in the device. In embodiments and referring to FIG. 1, the first access transistor 12 is a shared access transistor and the device 10 is a shared access transistor array, with multiple memory elements 22, 24, 26, 28 connected to and sharing the first access transistor 12. Typical memory elements have a footprint of about $4F^2$, and the memory elements 22, 24, 26, 28 may be formed over the first access transistor 12 in the device 10 to maximize memory element density and minimize device profile. As such, the shared access transistor array is particularly suitable for devices in which the first access transistor has a footprint of at least twice the area of the memory elements, such from 4 to 50 times the area of the memory elements, or from 4 to 25 times the area of the memory elements.

Various types of memory elements may be suitable for the device 10. In an embodiment, the first memory element 22 and the second memory element 24 include a first magnetic tunneling junction and a second magnetic tunneling junction, respectively. In the device 10 shown in FIG. 1, the first magnetic tunneling junction and the second magnetic tunneling junction each form a 1-transistor-1-magnetic tunneling junction cell with the first access transistor 12, and such cells are generally referred to as Spin-Transfer-Torque Random-Access Memory (STTRAM) cells. Magnetic tunneling junctions (MTJs) generally include two ferromagnetic layers with an insulating layer disposed therebetween. MTJs are known memory elements and generally require relatively high current to switch the MTJs from one magnetic orientation to another. As such, MTJs generally require relatively large access transistors, e.g., often on the order of $50F^2$, while the MTJs may have a footprint of about $4F^2$. Thus, the shared access transistor configuration may enable memory element density to be maximized with numerous MTJs formed over a single shared access transistor. However, current leakage generally increases current required through the first access transistor 12 in order to deliver the same current to a selected MTJ, and the current leakage may obscure a signal to the selected MTJ. Further, current leakage increases as the number of MTJs that share the access transistor increases. The two-terminal selectors 38, 40 effectively suppress current leakage and avoid the drawbacks associated therewith in the shared access transistor configuration, as described in further detail below, thereby enabling high density configurations for the devices 10 even with STTRAM cells.

In another embodiment, the first memory element 22 and the second memory element 24 include a first resistor and a second resistor, respectively. In the device 10 shown in FIG. 1, the first resistor and the second resistor each form a 1-transistor-1-resistor junction cell with the first access transistor 12, and such cells are generally referred to as Resistive Random-Access Memory (RRAM) cells. Resistors are known memory elements and can be switched under application of a current. Resistors used for memory elements generally require relatively lower current to switch than the MTJs. As such, resistors generally require relatively smaller access transistors, e.g., often on the order of $6F^2$, while the resistors may have a footprint of about $4F^2$. Thus, the shared access transistor configuration may not provide the significant memory element density gains that are realized with MTJs when formed over a single shared access transistor, yet nonetheless still enable memory element density to be increased. Further, current leakage is still a concern with RRAM configurations for the same reasons as described above, and the two-terminal selectors 38, 40 effectively suppress current leakage and avoid the drawbacks associated therewith in the shared access transistor configuration, as described in further detail below.

The first two-terminal selector 38 and the second two-terminal selector 40 are primarily provided to inhibit current leakage from impacting operation of the device 10, as set forth above. To effectively inhibit current leakage from a selected memory element and associated bitline through non-selected memory elements and bitlines, the two-terminal selectors 38, 40, 42, 44 may be non-linear selectors. By "non-linear", it is meant that the two-terminal selectors have different resistances at different voltages, e.g., lower resistance at higher voltages. In embodiments, the two-terminal selectors 38, 40, 42, 44 are unidirectional or bidirectional, meaning that the different resistances of the selectors exhibit the non-linearity independent of a direct of current flow through the selector. Depending upon a programming and erasing configuration of the device 10, the unidirectional or bidirectional two-terminal selectors may be used. For example, in embodiments, programming and erasing are conducted in the same bias direction, i.e., the memory elements are unipolar, under which scenario a unidirectional or bidirectional selector may be employed. In other embodiments, programming and erasing are conducted in opposite bias directions, under which scenario only a bidirectional selector may be employed. For example, STTRAM cells that include an MTJ as the memory element generally program in one direction and erase in an opposite direction and, therefore, generally include the bidirectional selector. However, some STTRAM cells also program and erase in the same bias direction (e.g., voltage-controlled magnetic anisotropy).

All memory elements 22, 24, 26, 28 may have a two-terminal selector 38, 40, 42, 44 associated therewith to effectively inhibit current leakage. To explain, when a particular memory element is selected, current leakage to the other unselected memory elements that share the first access transistor 12 results in shared voltage, with each of the unselected memory elements pulling current at a fraction of the voltage of the selected memory element equal to the number of unselected memory elements that share the first access transistor 12. At the relatively high voltage of current passing through the selected memory element, the associated two-terminal resistor exhibits low resistance to allow current to properly pass through the selected memory element. However, at the relatively lower voltage of leakage current passing through unselected memory elements, resistance of the associated two-terminal selectors is relatively high and effectively blocks current leakage. In this regard, the two-terminal selectors 38, 40, 42, 44 are effectively activated by virtue of the high voltage associated with selected memory elements.

In embodiments and as shown in FIG. 1, the first two-terminal selector 38 and the second two-terminal selector 40 are bidirectional selectors. Suitable bidirectional selectors may be chosen from varistors or metal-insulator-metal (MIM) elements. Suitable varistors, also known as voltage-dependent resistors, include a series of dielectric layers disposed between two metal layers that function as the terminals. For example, in an embodiment, the two metal layers include platinum and the series of dielectric layers includes two tantalum oxide-containing layers with a titanium oxide layer disposed therebetween. Suitable MIM elements include a dielectric layer disposed between two electrically-conductive layers. For example, in an embodiment, the two electrically-conductive layers include tantalum nitride or titanium nitride, and the dielectric layer includes silicon nitride, silicon oxide, or another insulating metal oxide.

In other embodiments, the first two-terminal selector 38 and the second two-terminal selector 40 are diode selectors, which are also referred to as rectifying diode selectors and exhibit unidirectional properties. Conventional diode selectors may be employed, including those chosen from p-n junctions and metal Schottky junctions (which include semiconducting oxides). Examples of p-n junction diode selectors that may be used include oxide-based or metal silicon p-n junctions.

Figure 2:
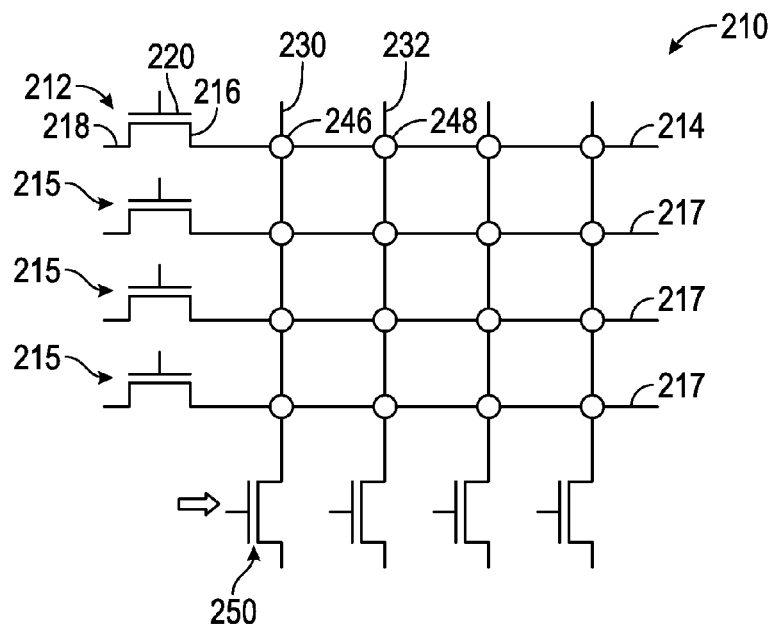
FIG. 2 is a schematic diagram of a non-volatile random access memory device including a crossbar array of access transistors with multiple memory element and two-terminal selector pairs disposed at crossbar junctions in accordance with another embodiment.

Referring to FIG. 2, another embodiment of a non-volatile RAM device 210 will now be described. As with the embodiment of the device 10 shown in FIG. 1, the non-volatile RAM device 210 of FIG. 2 includes a first access transistor 212 that is in electrical communication with a wordline 214, with the first access transistor 212 being a wordline access transistor of a crossbar array. It is to be appreciated that additional wordlines 217 may be present with additional access transistors 215 in electrical communication with the additional wordlines 217 to form an array. The first access transistor 212 includes a source 216, a drain 218, and a gate structure 220 in accordance with conventional transistor architecture (it is to be appreciated that the relative positions of the source 216 and the drain 218 may be transposed). The wordline 214 is in electrical communication with the source 216 of the first access transistor 212. A first memory element 222 and a first two-terminal selector 238 are serially connected and disposed at a crossbar junction 246 between the wordline 214 and a first bitline 230, with the first memory element and the first two-terminal selector in electrical communication with the first access transistor 212 and the first bitline 230. A second memory element and a second two-terminal selector are disposed at another crossbar junction 248 between the wordline 214 and a second bitline 232, with the second memory element and the second two-terminal selector in electrical communication with the first access transistor 212 and the second bitline 232. It is to be appreciated that the device 210 may include numerous additional memory element and two-terminal selector pairs at the various crossbar junctions, with FIG. 2 showing 16 crossbar junctions for illustrative purposes only. The first access transistor 212 controls access to memory elements at the crossbar junctions 246, 248 that are connected to the wordline 214 associated with the first access transistor 212. A second access transistor 250 controls access to memory elements at the crossbar junction 246 that is connected to the wordline 214 associated with the second access transistor 250, and current applied to the first bitline 230 controls programming and/or erasing of the first memory element disposed at crossbar junction 246.

Figure 3:
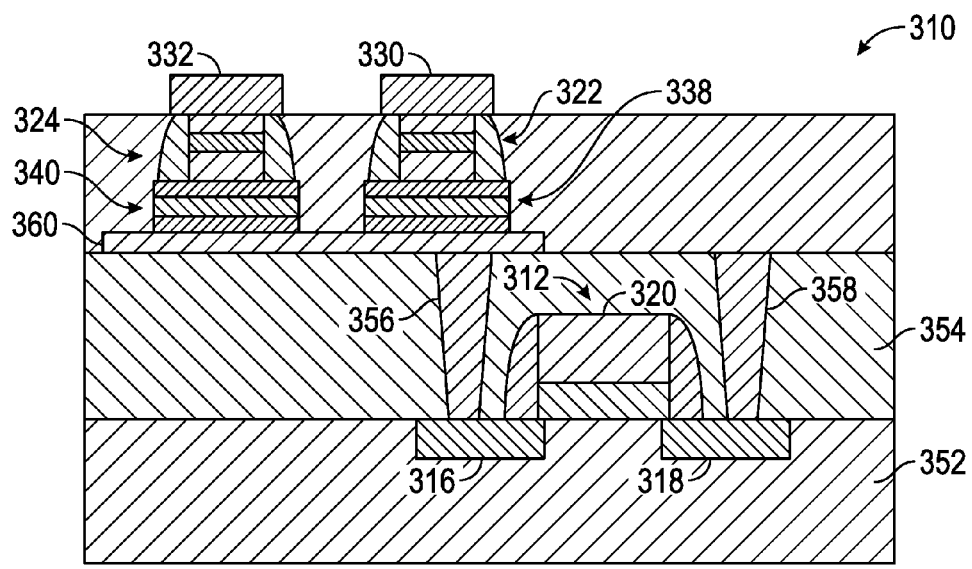
FIG. 3 is a schematic cross-sectional side view of a portion of a non-volatile random access memory device including an access transistor with two memory element and two-terminal selector pairs electrically connected to the access transistor in accordance with another embodiment.

A method of forming a non-volatile RAM device 310 will now be described with reference to FIG. 3. The method may be employed to form the non-volatile RAM device 10 shown in FIG. 1, although the non-volatile RAM device 10 shown in FIG. 1 is not limited to the structure of the non-volatile RAM device 310 shown in FIG. 3. Further, the method may be adapted to form the non-volatile RAM device 210 shown in FIG. 2. In accordance with the exemplary method and referring to FIG. 3, a first access transistor 312 is formed on a semiconductor substrate 352, and the first access transistor 312 may be formed through conventional transistor fabrication techniques to include a source 316, a drain 318 and a gate structure 320 in accordance with conventional transistor architecture (it is to be appreciated that the relative positions of the source 316 and the drain 318 may be transposed). An interlayer dielectric layer 354 is formed over the first access transistor 312 and interconnects 356, 358 are formed through the interlayer dielectric layer 354 to establish an electrical connection with the source 316 and drain 318, respectively. A shared electrical connection 360 is formed over the interlayer dielectric layer 354. A first memory element 322 and a second memory element 324 are formed in electrical communication with the first access transistor 312, e.g., through the shared electrical connection 360. A first two-terminal selector 338 is formed serially connected with the first memory element 322, and a second two-terminal selector 340 is formed serially connected with the second memory element 324. In this embodiment, the first memory element 322 and the second memory element 324 are formed after forming the first two-terminal selector 338 and the second two-terminal selector 340, which is suitable under conditions where the first two-terminal selector 338 and the second two-terminal selector 340 are formed at temperatures that may compromise the first memory element 322 and the second memory element 324. For example, in this embodiment, the first memory element 322 and the second memory element 324 may include a first resistor and a second resistor and the non-volatile RAM device 310 may be a RRAM device. A first bitline 330 is then formed in electrical communication with the first memory element 322 and the first two-terminal selector 338 and a second bitline 332 is formed in electrical communication with the second memory element 324 and the second two-terminal selector 340.

Figure 4:
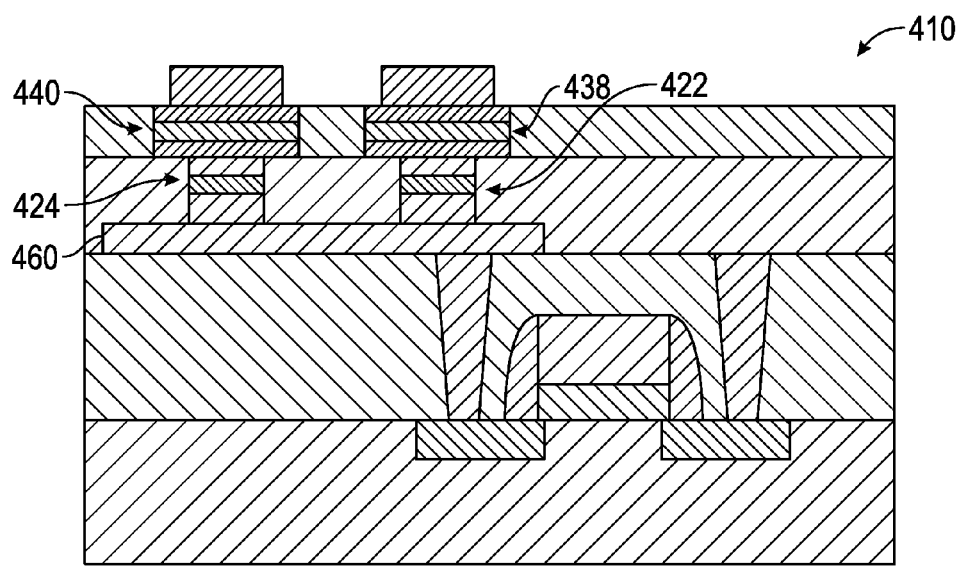
FIG. 4 is a schematic cross-sectional side view of a portion of a non-volatile random access memory device including an access transistor with two memory element and two-terminal selector pairs electrically connected to the access transistor in accordance with another embodiment.

Another embodiment of a method of forming a non-volatile RAM device 410 will now be described with reference to FIG. 4. In this embodiment, the non-volatile RAM device 410 is formed in the same manner as the non-volatile RAM device 310 described above with regard to FIG. 3, but with a first two-terminal selector 438 and a second two-terminal selector 440 formed after forming a first memory element 422 and a second memory element 424. In this embodiment, the order of formation of the two-terminal selectors 438, 440 and the memory elements 422, 424 is appropriate when quality and performance of the memory elements 422, 424 is dependent upon planarity of the underlying surface upon which the memory elements 422, 424 are formed. For example, in this embodiment, the first memory element 422 and the second memory element 424 may include a first magnetic tunneling junction and a second magnetic tunneling junction. Planarity of the two-terminal selectors 438, 440 is generally inferior to planarity of a shared electrical connection 460 upon which the two-terminal selectors 438, 440 and the memory elements 422, 424 are formed. To avoid compromise of the memory elements 422, 424, materials for the two-terminal selectors 438, 440 may be chosen that can be deposited at relatively low temperatures. For example, various oxide-based selector materials are available that can be deposited at or close to room temperatures.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A non-volatile random access memory device comprising:
   a first access transistor in electrical communication with a wordline;
   a first memory element and a first two-terminal selector serially connected and in electrical communication with a first bitline and the first access transistor, wherein the first two-terminal selector is disposed between the first memory element and the first bitline; and
   a second memory element and a second two-terminal selector serially connected and in electrical communication with a second bitline and the first access transistor, wherein the second two-terminal selector is disposed between the second memory element and the second bitline.

2. The non-volatile random access memory device of claim 1, wherein the first memory element and the second memory element share a connection to the first access transistor.

3. The non-volatile random access memory device of claim 1, wherein the first memory element and the second memory element comprise a first magnetic tunneling junction and a second magnetic tunneling junction, respectively.

4. The non-volatile random access memory device of claim 3, wherein the first magnetic tunneling junction and the second magnetic tunneling junction each form a 1-transistor-1-magnetic tunneling junction cell with the first access transistor.

5. The non-volatile random access memory device of claim 1, wherein the first memory element and the second memory element comprise a first resistor and a second resistor, respectively.

6. The non-volatile random access memory device of claim 5, wherein the first resistor and the second resistor each form a 1-transistor-1-resistor junction cell with the first access transistor.

7. The non-volatile random access memory device of claim 1, wherein the first two-terminal selector and the second two-terminal selector are non-linear selectors.

8. The non-volatile random access memory device of claim 7, wherein the first two-terminal selector and the second two-terminal selector are diode selectors.

9. The non-volatile random access memory device of claim 8, wherein the first two-terminal selector and the second two-terminal selector are chosen from p-n junctions and metal Schottky junctions.

10. The non-volatile random access memory device of claim 7, wherein the first two-terminal selector and the second two-terminal selector are bidirectional selectors.

11. The non-volatile random access memory device of claim 10, wherein the first two-terminal selector and the second two-terminal selector are chosen from varistors or metal-insulator-metal elements.

12. The non-volatile random access memory device of claim 1, further comprising from 1 to about 50 additional memory element and two-terminal selector pairs serially connected and in electrical communication with a respective bitline and the first access transistor.

13. The non-volatile random access memory device of claim 1, wherein the first access transistor is a shared access transistor of a shared access transistor array.

14. The non-volatile random access memory device of claim 1, wherein the first access transistor is a wordline access transistor of a crossbar array.

* * * * *